United States Patent [19]

Tamamura et al.

[11] 4,426,247

[45] Jan. 17, 1984

[54] METHOD FOR FORMING MICROPATTERN

[75] Inventors: Toshiaki Tamamura, Katsuta; Saburo Imamura, Mito; Masao Morita; Osamu Kogure, both of Mito, all of Japan

[73] Assignee: Nippon Telegraph & Telephone Public Corporation, Tokyo, Japan

[21] Appl. No.: 482,613

[22] Filed: Apr. 6, 1983

[30] Foreign Application Priority Data

Apr. 12, 1982 [JP] Japan .................................. 57-59612
Feb. 14, 1983 [JP] Japan .................................. 58-21731

[51] Int. Cl.³ .................. B44C 1/22; C03C 15/00; C03C 25/06; B29C 17/08
[52] U.S. Cl. .................................. 156/643; 156/646; 156/652; 156/655; 156/659.1; 156/904; 204/192 E; 252/79.1; 427/43.1; 430/313; 430/317
[58] Field of Search ............... 156/643, 646, 652, 655, 156/659.1, 668, 904; 427/38, 39, 40, 41, 43.1; 204/192 E, 159.11, 159.14; 430/312, 313, 317, 5; 252/79.1

[56] References Cited

U.S. PATENT DOCUMENTS 4,195,108  3/1980  Gazard et al. ................. 427/43.1 X
4,370,405  1/1983  O'Toole et al. ....................... 430/312

Primary Examiner—William A. Powell
Attorney, Agent, or Firm—Frishauf, Holtz, Goodman & Woodward

[57] ABSTRACT

A method for forming a micropattern, comprises the steps of forming an organic polymeric material layer on a substrate, forming a silicone layer on the organic polymeric material layer, selectively irradiating a surface of the silicone layer with a high-energy beam, exposing the surface of the silicone layer to a radical addition polymerizable monomer gas so as to form a graft polymer film on an irradiated portion of the surface of the silicone layer, performing reactive ion etching using the graft polymer film as a mask so as to form a silicone pattern, and performing reactive ion etching using the silicone pattern as a mask so as to form an organic polymeric material pattern. The method allows formation of a resist pattern with a high precision and a high aspect ratio.

12 Claims, 2 Drawing Figures

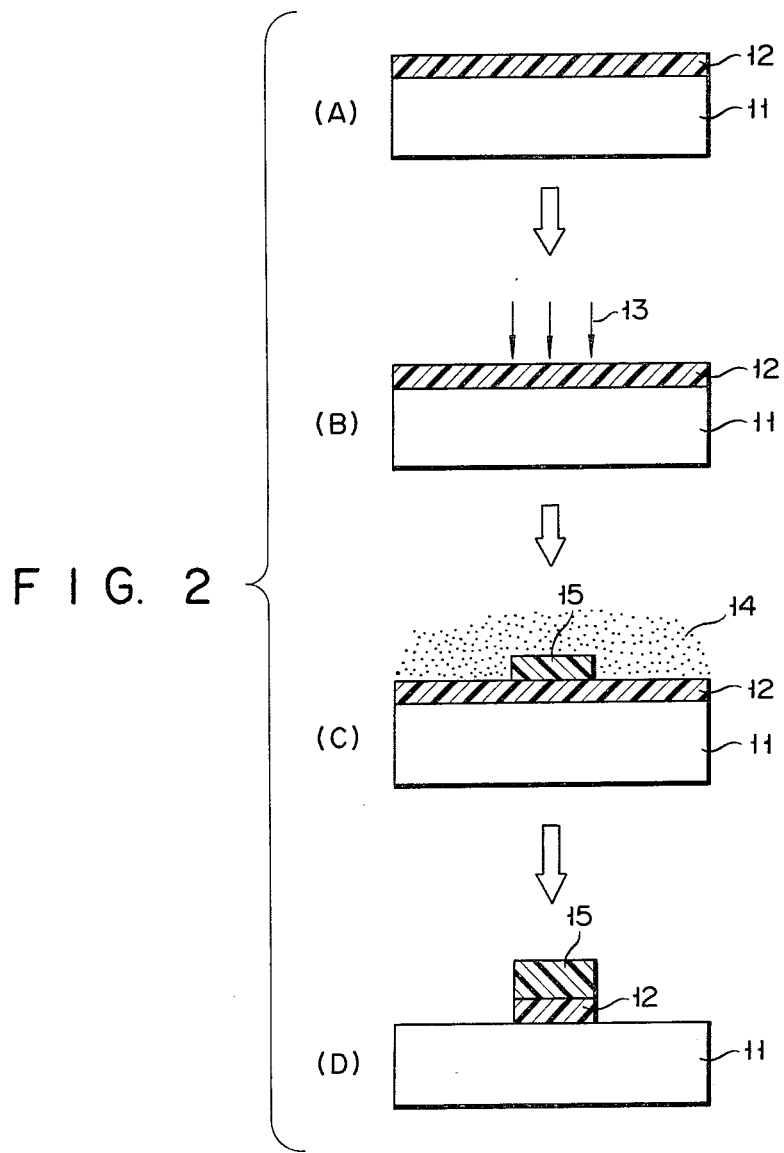
F I G. 2

METHOD FOR FORMING MICROPATTERN

BACKGROUND OF THE INVENTION

The present invention relates to a method for forming a resist pattern on a substrate by utilizing vapor phase graft polymerization.

In the conventional method for manufacturing ICs and LSIs, substrate surfaces are processed using a resist pattern of a polymer compound or the like. First, a resist film is formed on the surface of a substrate. The resist film is then irradiated with a high energy beam such as an ultraviolet ray, a far-ultraviolet ray, an X-ray beam or an electron beam. Then, an electrostatic latent image is formed in the resist film due to the chemical reaction. The image is developed to form the desired resist pattern.

With recent tendency toward farther micronization of a semiconductor element for an LSI, the resist material for forming such a resist pattern must have high sensitivity and resolution against an energy beam and must also have excellent etching resistance during processing of the substrate. This is because dry etching is more often used for processing a substrate since conventional wet chemical etching using an etching solution can only provide a low processing precision. However, requirements of sensitivity, resolution and etching resistance of the resist material cannot simultaneously be satisfied; a resist material which is excellent in all these properties has not yet been developed.

Micronization of LSI elements has also brought about another problem. When the wiring size for an element is decreased, the wiring resistance is increased and high-speed switching of the element may not be achieved. For this reason, the thickness of the wiring layer must be increased. This results in a significant step portion formed on the processed surface of the substrate. In order to process such a substrate surface, a resist film of a relatively great thickness must be used. However, the use of a relatively thick resist film generally results in a low resolution. This tendency is particularly notable when a negative-type resist is used which utilizes crosslinking. This is because swelling occurs at the crosslinked portion of the resist during wet developing such as spray developing or immersion in solvent. In the conventional method for forming an LSI element pattern by irradiation of a wafer with an electron beam or an ion beam, a negative-type resist may be more efficiently used. When the wet developing method is adopted, there arises another problem of low yield of element formation in addition to the problem of low resolution. The low yield is caused by formation of pinholes due to partial dissolution of the soluble resist component and by formation of defects due to dust or impurities in the developing solution.

In view of this situation, extensive studies are currently made in an attempt to develop an effective material and method for forming a resist pattern by dry etching.

G. N. Taylor reported the following method in Journal of the Electrochemical Society, Vol. 127, pp. 2,665 (1980) and in Journal of Vacuum Science and Technology, Vol. 19, pp. 872, (1981). The resist material for forming a resist film consists of polydichloropropyl acrylate as an organic polymer compound and a monomer. The monomer is selected which reacts with the polymer upon irradiation of the polymer with a high-energy beam. After the resist layer is irradiated with the high-energy beam, it is heated in a vacuum to remove the monomer from the non-irradiated portion of the resist layer. When plasma etching is thereafter performed, the etching rate of the irradiated portion of the resist film is slower than that at the non-irradiated portion. This is because the monomer is contained in the irradiated portion of the resist film. Thus, the resist pattern may be formed. Many other literatures also report methods which combine dry etching and removal of a low-molecular compound by heating under a vacuum state similar to that used in the Taylor's method. However, in accordance with all these methods, the polymer material as a base of the resist film including both the irradiated and non-irradiated portions is the same. For this reason, a sufficient selective ratio beween the etching rates of these portions during dry etching may not be obtained, resulting in too far etching of the irradiated portions.

Harada et al has also proposed a method for forming a resist pattern on a substrate by dry etching in Japanese Patent Application No. 56-184495. According to this method, a resist film formed on a surface of a substrate is irradiated with a high-energy beam in a desired pattern to obtain an active point. Then, a radical addition polymerizable monomer is introduced to allow selective graft polymerization on the irradiated portion of the resist film. Using the thus obtained graft polymer pattern, the resist pattern is formed on the substrate by dry etching. According to this method of Harada et al, the resist film consists of a polymeric material which has low resistance to dry etching such as polymethyl methacrylate, and the graft polymer pattern consists of a polymeric material which has high resistance to dry etching such as polystyrene. Thus, this method utilizes the difference between the etching rates of these two polymeric materials. However, even with this method, in order to prepare a resist pattern with a good aspect ratio by forming a thick resist film, the graft polymer pattern must also be relatively thick. Then, the dose of the high-energy beam to be radiated onto the resist film must be increased and the time for graft polymerization must also be increased. Furthermore, since graft polymerization is anisotropic, deep etching also results in wide etching, resulting in a low resolution. Graft polymerization progresses in the resist film vertically as well as laterally, further degrading resolution.

SUMMARY OF THE INVENTION

It is an object of the present invention to provide a method for forming a micropattern, which allows formation of a resist pattern of high resolution and high aspect ratio by a small dose of a high-energy beam and a short graft polymerization time.

In accordance with an aspect of the present invention there is provided a method for forming a micropattern, comprising the steps of:

forming an organic polymeric material layer on a substrate;

forming a silicone layer on said organic polymeric material layer;

selectively irradiating a surface of said silicone layer with a high-energy beam;

exposing the surface of said silicone layer to a radical addition polymerizable monomer so as to form a graft polymer film on an irradiated portion of the surface of said silicone layer;

performing dry etching using said graft polymer film as a mask so as to form a pattern of said silicone layer; and performing dry etching using said pattern of said silicone pattern as a mask so as to form a pattern of said organic polymeric material layer.

In the method of the present invention, when a ternary curing-type silicone resin having a vinyl group is used as the silicone, resolution is further improved, and irradiation time of the high-energy beam and graft polymerization time are further shortened.

If a ternary curing-type silicone resin having a vinyl group is used, the organic polymeric material layer may be omitted, and the silicone resin layer may be formed directly on the substrate.

Dry etching for forming the silicone pattern is preferably reactive ion etching using a gas mixture of $CF_4$ and $H_2$ gases, and dry etching for forming the organic polymeric material pattern is preferably reactive ion etching using $O_2$ gas.

BRIEF DESCRIPTION OF THE DRAWINGS

FIGS. 2A to 2D are sectional views showing steps of a method for forming a pattern according to another embodiment of the present invention.

DETAILED DESCRIPTION OF THE PREFERRED EMBODIMENTS

Figure 1:
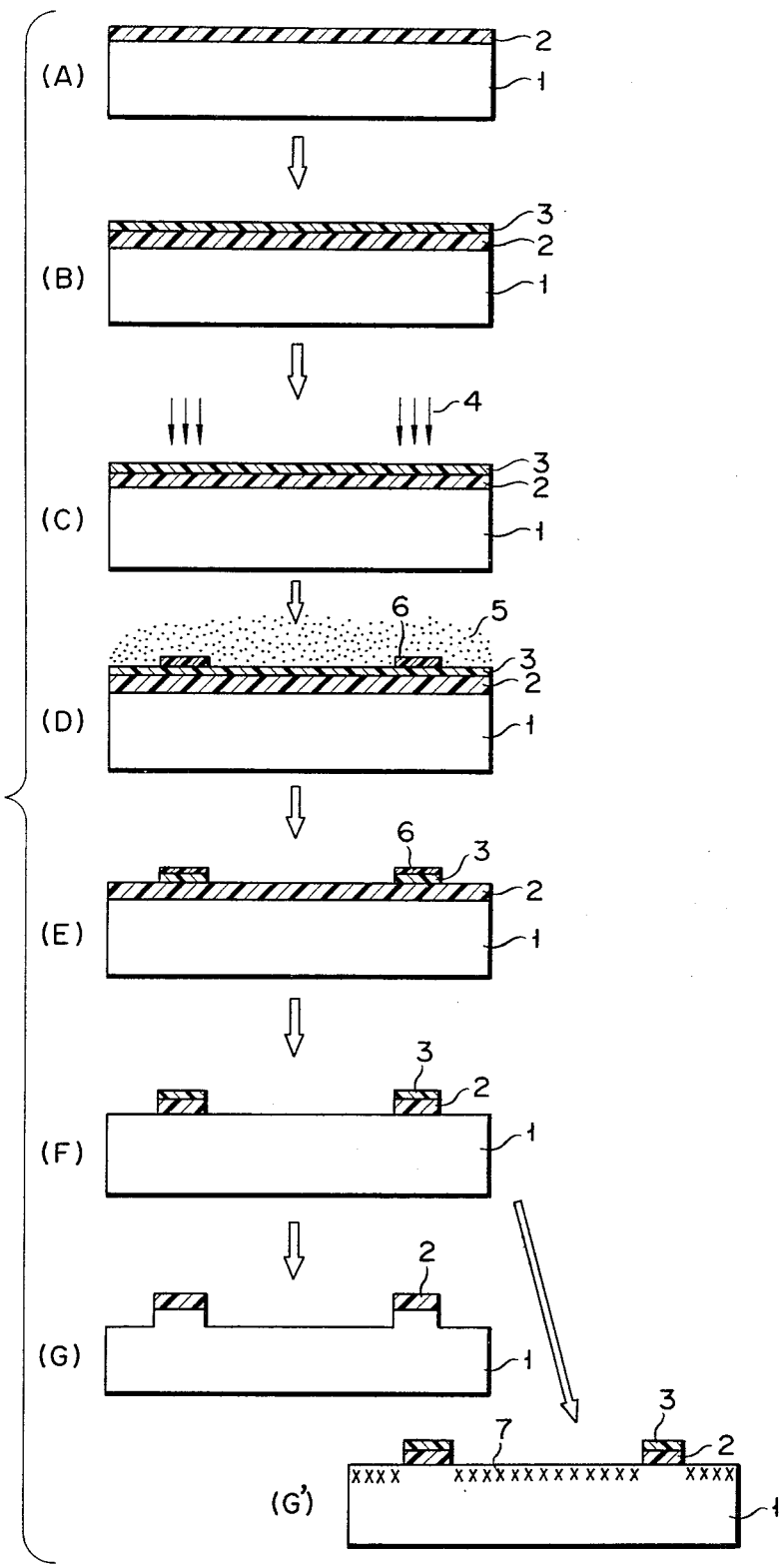
FIGS. 1A to 1G and 1G' are sectional views showing the steps of a method for forming a pattern according to an embodiment of the present invention.

According to the method of the present invention, the silicone layer effectively forms an active point upon irradiation with a high-energy beam, graft polymerization can be initiated in a monomer gas atmosphere, and the graft polymer pattern is hardly etched by a dry etching method which has a high etching rate of the organic polymeric material layer.

Even if a very thin silicone resin layer is used in the method of the present invention, its pattern may be transferred to a relatively thick organic polymeric material layer. Therefore, a thin graft polymer pattern may be used as a mask for etching the silicone resin layer. Degradation in resolution which may be caused by a thick graft polymer pattern may therefore be prevented. Furthermore, the dose of the high-energy beam required may be reduced, that is, sensitivity for the high-energy beam may be improved, and graft polymerization time may be shortened.

The method of the present invention will now be described in more detail with reference to the accompanying drawings.

FIGS. 1A to 1G and 1G' show the steps of a method for forming a micropattern according to the first embodiment of the present invention.

More specifically, FIG. 1A shows the step of forming an organic polymeric material layer 2 on a substrate 1, FIG. 1B shows the step of forming a silicone layer 3, FIG. 1C shows the step of irradiation with a high-energy beam 4, FIG. 1D shows the step of graft polymerization by introduction of a graft monomer gas 5, FIG. 1E shows the step of etching the silicone layer 3 using a graft polymer pattern 6 as a mask, and FIG. 1F shows the step of etching the organic polymeric material layer 2 using the silicone pattern as a mask, FIG. 1G shows the step of etching the substrate 1, and FIG. 1G' shows the step of doping the substrate 1 with a dopant 7.

Referring to FIG. 1A, a relatively thick organic polymeric material layer 2 of about 1 μm thickness is formed on the surface of a substrate 1. Then, a relatively thin silicone layer 3 of about 0.1 μm is formed thereover (FIG. 1B). The substrate 1 with these layers 2 and 3 is then irradiated with a high-energy beam in a desired pattern (FIG. 1C). The high-energy beam may be an electron beam, an X-ray, an ion beam, or a far-ultraviolet ray. The substrate 1 is then placed in an atmosphere of a radical addition polymerizable monomer gas 5 without exposure to ambient air so as to form a graft polymer pattern 6 (FIG. 1D). Although the graft polymer pattern may be formed after the substrate is exposed to the air, a dose of the beam must then be increased and resolution is degraded in that case. The thickness of the graft polymer pattern may be increased with an increase in the graft polymerization time. However, the graft polymer pattern must only be formed to a thickness for allowing removal of the silicone layer as the upper layer of the resist film by dry etching. If the silicone layer has a thickness of 0.1 μm, the graft polymer pattern need to have a thickness of about 0.2 μm. Subsequently, using the graft polymer pattern as a mask, the region of the silicone layer 3 which is not covered with the graft polymer pattern 6, that is, the non-irradiated portion of the silicone layer 3 is etched by dry etching, preferably, reactive ion etching (FIG. 1E). The etching gas to be used may be a gas mixture of, preferably, $CF_4$ and $H_2$, which etches the silicone faster than the graft polymer. Using the thus obtained pattern of the silicone layer as a mask, the organic polymeric material layer 2 corresponding to the non-irradiated portion is etched by dry etching, preferably, reactive ion etching (FIG. 1F). The etching gas may preferably by $O_2$ gas which etches the silicone layer slower than the organic polymeric material layer. In this manner, an organic polymeric material pattern of a relatively great thickness can be formed using such a thin graft polymer pattern. Thereafter, using the organic polymeric material pattern as a mask, the underlying substrate 1 is etched (FIG. 1G) or is doped with an impurity (FIG. 1G').

The second embodiment of the present invention will now be described with reference to FIGS. 2A to 2D.

A layer 12 of a ternary curing-type silicone resin having a vinyl group is formed on a substrate 11 (FIG. 2A). Subsequently, the surface of the silicone resin layer 12 is selectively irradiated with a high-energy beam 13 (FIG. 2B).

The surface of the silicone resin layer 13 is exposed to the atmosphere of a radical addition polymerizable monomer gas 14 so as to form a graft polymer pattern 15 on the irradiated portion (FIG. 2C).

Using the graft polymer pattern 15 as a mask, dry etching, preferably reactive ion etching using a gas mixture of $CF_4$ and $H_2$ is performed to form a silicone resin pattern (FIG. 2D).

The radical addition polymerizable monomer gas may be an organic monomer gas which is capable of graft polymerization and which may be kept in the gas phase. Examples of the graft monomer gas may include styrene, divinylbenzene, vinyltoluene, acrylonitrile, methyl methacrylate, methacrylic acid, methyl acrylate, maleimide or the like. The silicone to be used in the present invention may include polydimethylsiloxane, polyvinylmethylsiloxane, polymethylphenylsiloxane, polymethylcyclosiloxane, polyvinylmethylsiloxane, polymethylphenylcyclosiloxane, or the like. Ternary curing-type silicone resins having vinyl groups are preferably used.

In the first embodiment, the material of the ogranic polymeric material layer 2 as the lower layer of the resist film is not particularly limited only if it may not be dissolved in a coating solution for forming the silicone layer 3. However, a material is preferably used which is resistant to processing of the substrate 1. That is, a material is preferably used which is resistant to dry etching reactive gas other than oxygen gas, does not cause introduction of impurities into the substrate 1, and is suitable for semiconductor processing. Of various materials, polyimide is most preferable since it is insoluble in most organic solvents, and is highly resistant to heat and processing. However, an AZ-type photoresist, a copolymer of acrylic acid or methacrylic acid with its aromatic ester, or polystyrene may alternatively be used.

The present invention will now be described by ways of its examples. However, the present invention is not limited thereto, and various combinations of the materials may be made.

EXAMPLE 1

A varnish of polyamide acid (PI 2500 of Du Pont de Nemours) was coated to a thickness of 1.1 $\mu$m on the thermally oxidized silicon substrate by spin coating. The coated substrate was heated at 300° C. for 1 hour to form a polyimide film of about 0.9 $\mu$m thickness. A polydimethylsiloxane gum containing a vinyl group (SH410 of Toray Silicone, Inc.) was spin-coated to a thickness of 0.1 $\mu$m thereover from n-butyl acetate as a solution. After drying under a nitrogen stream at 100° C. for 30 minutes, it was exposed to an electron beam with an accelerating voltage of 20 kV to draw line patterns of 5 $\mu$m width at various doses. The sample was then moved into a vacuum chamber at $10^{-3}$ Torr without being exposed to ambient air. A refined and degassed methyl methacrylate monomer gas was introduced into the vacuum chamber to a pressure of 3 Torr and the sample was left to stand for 1 hour so as to initiate graft polymerization at the irradiated portion of the resist film. Microscopic observation of the resist film revealed formation of a glossy graft polymer polymethyl methacrylate film on the irradiated portion of the resist film and non-formation of such film on the non-irradiated portion. The electron beam dose of about 60 $\mu$C/cm$^2$ was required to form a grafted polymethyl methacrylate film of about 0.2 $\mu$m thickness.

After the sample was heated at 150° C. for 30 minutes in the air, it was subjected to reactive ion etching using a gas mixture of CF$_4$ gas and 10% of H$_2$ gas. Thus, non-irradiated portion of the polydimethylsiloxane film which was not covered with the graft polymer was removed. The ratio of the etching rates of the graft polymer polymethyl methacrylic film and of the polydimethylsiloxane in the CF$_4$ and H$_2$ gas mixture was about 1:1.3. Thus, using the graft polymer polymethyl methacrylate film of 0.2 $\mu$m thickness as a mask, the polydimethylsiloxane film of 0.1 $\mu$m thickness could be sufficiently removed. Subsequently, the portion of the polyimide film which was not covered with the polydimethylsiloxane film was removed by reactive ion etching using oxygen gas. The ratio of the etching rates of the polyimide film and the polydimethylsiloxane film in oxygen at a pressure of 0.03 Torr and a gas flow rate of 5 cc/min was about 40:1. Therefore, even after the portion of the polyimide film corresponding to the non-irradiated portion of the resist film was completely removed, its portion corresponding to the irradiated portion was not substantially etched. In this manner, the graft polymer pattern of 0.2 $\mu$m thickness was transferred into the polyimide film of 0.9 $\mu$m thickness. Using the polyimide film of 0.9 $\mu$m thickness as a mask, the silicon oxide was etched by reactive ion etching using a gas mixture of CF$_4$ gas and H$_2$ gas to form a pattern of 1 $\mu$m depth.

EXAMPLES 2 TO 6

Polyimide films of 0.9 $\mu$m thickness were formed on five thermally oxidized silicon substrates in a similar manner to that in Example 1. A film of polydimethylsiloxane gum having a vinyl group (SH-410 of Toray Silicone, Inc.) was coated on each substrate to a thickness of 0.1 $\mu$m. After drying each sample in nitrogen steam at 100° C. for 30 minutes, line patterns of 5 $\mu$m width were drawn at various doses and at an acceleration voltage of 20 kV with an electron beam scanner. Thereafter, the sample was placed in a vacuum chamber kept at $10^{-3}$ Torr without being exposed to the ambient air. For the respective samples, the radical addition polymerizable monomer gaes were introduced at pressures of 1 to 3 Torr. More specifically, styrene was used for Example 2, divinylbenzene was used for Example 3, acrylonitrile was used for Example 4, methyl acrylate was used for Example 5, and maleimide was used for Example 6. The samples were then left to stand for 1 hour. In each case, formation of a glossy graft polymer film was observed only on the irradiated portion. The electron beam dose for forming a graft polymer pattern of 0.2 $\mu$m thickness for each sample is shown in Table 1 below.

TABLE 1

Electron beam sensitivity for formation of graft polymer pattern (0.2 $\mu$m graft polymer pattern thickness, 1 hour graft polymerization time, 20 kV acceleration voltage, 0.9 $\mu$m thick polyimide film as the lower layer of the resist film, and 0.1 $\mu$m thick layer of polydimethylsiloxane gum having a vinyl group as the upper layer of the resist film)

| Example | Monomer gas | Electron beam dose ($\times 10^{-6}$ C/cm$^2$) |
|---|---|---|
| 2 | Styrene | 120 |
| 3 | Divinylbenzene | 95 |
| 4 | Acrylonitrile | 160 |
| 5 | Methyl acrylate | 80 |
| 6 | Maleimide | 220 |

For each sample, the graft polymer pattern was transferred into the polyimide film in the same manner as oxide film in the surface layer of the substrate was etched to a depth of 1.0 $\mu$m.

EXAMPLES 7 TO 8

A solution of methyl methacrylate-methacryl acid copolymer (70% methyl methacrylate content; 235,000 weight-average molecular weight) in ethyl cellosolve acetate was coated to a thickness of 1.2 $\mu$m on the thermally oxidized surfaces of four substrates. Each sample was heated at 220° C. for 1 hour in the air. Silicone layers of 0.1 $\mu$m thickness were formed on the respective subtrates. A polydimehyl silicone (SH-200; 10$^5$ c/s viscosity; product of Toray Silicone, Inc.) was used for Example 7. A polymethylphenylsilicone resin (SH-510; 1,000 c/s viscosity; product of Toray Silicone, Inc.) was used for Example 8. After each sample was dried under a nitrogen stream at 100° C. for 30 minutes, it was exposed to form line patterns of 5 μm width at an acceleration voltage of 20 kV with an electron beam scanner. Each sample was then placed in a vacuum chamber kept at $10^{-3}$ Torr without being exposed to the ambient air. Methyl methacrylate at 3 Torr was introduced into the vacuum chambers for graft polymerization for 1 hour. Glossy graft polymer patterns were formed only on the irradiated portions of the resist films in all the samples. The dose for forming a graft polymer pattern of 0.2 μm thickness within a 1 hour graft polymerization is shown in Table 2 below.

TABLE 2

Electron beam sensitivity for formation of graft polymer pattern (0.2 μm graft polymer pattern thickness, methyl methacrylate as monomer gas, 1 hour graft polymerization time, 20 kV electron beam acceleration voltage, 1.2 μm thick methyl methacrylate-methacrylic acid copolymer as lower layer of resist film)

| Example | Monomer gas | Electron beam dose ($\times 10^{-6}$ C/cm$^2$) |
|---|---|---|
| 7 | Polydimethyl-silicone (SH-200) | 130 |
| 8 | Polymethylphenyl-silicone (SH-510) | 190 |

Thereafter, the graft polymer pattern was transferred to the methyl methacrylate-methacrylic acid copolymer film in the same manner as in Example 1. The silicon oxide film in the surface layer of the substrate was etched to a depth of 1 μm using the obtained pattern.

EXAMPLES 9 TO 11

A solution of methyl methacrylate-methacrylic acid copolymer (70% methyl methacrylate content; 235,000 weight-average molecular weight) in ethyl cellosolve acetate was coated to a thickness of 1.2 μm on three silicon substrates. The coatings were dried at 220° C. for 1 hour. A polydimethylsiloxane gum having a vinyl group (SH-410 of Toray Silicone, Inc.) was coated to a thickness of 0.1 μm on each sample and was dried at 100° C. for 30 minutes. Using a 400 mesh copper mesh as a mask, the sample was irradiated with an X-ray from a Cu-L line (13.3 Å) for Example 11, with a far-ultraviolet ray from a 500 W Xe-Hg lamp for Example 12, and with an ion beam at 34 kV acceleration voltage from a liquid Ga-ion source for Example 13. The samples were transferred to vacuum chambers kept at $10^{-3}$ Torr without being exposed to the air. A methyl methacrylate gas was introduced into the vacuum chambers for 1 hour for graft polymerization. Then, the uniform glossy graft polymer patterns were formed on the irradiated portions of the resist films in the respective samples. The dose of the respective energy beams required to form graft polymer patterns within 1 hour is shown in Table 3 below.

TABLE 3

High-energy sensitivity for forming graft polymer pattern (0.2 μm graft polymer pattern thickness, methyl methacrylate as monomer gas, 1 hour graft polymerization time, methyl methacrylate-methacrylic acid copolymer for lower layer of resist film, and polydimethylsiloxane having a vinyl group (SH-410) for upper layer of resist film)

| Example | Exposure source | Sensitivity |
|---|---|---|
| 9 | CU—L line (13.3 Å) | 21 J/cm$^2$ |
| 10 | Xe—Hg lamp (500 W) | 20 minute |

TABLE 3-continued

High-energy sensitivity for forming graft polymer pattern (0.2 μm graft polymer pattern thickness, methyl methacrylate as monomer gas, 1 hour graft polymerization time, methyl methacrylate-methacrylic acid copolymer for lower layer of resist film, and polydimethylsiloxane having a vinyl group (SH-410) for upper layer of resist film)

| Example | Exposure source | Sensitivity |
|---|---|---|
| 11 | Ga—ion (34 kV) | radiation 0.25 μC/cm$^2$ |

Thereafter, the graft polymer pattern was transferred to the methyl methacrylate-methacrylic acid copolymer of 1.2 μm thickness in the same manner as that in Example 1. Using the obtained pattern, the surface layer of each sample was etched to a depth of 1 μm.

EXAMPLE 12

A varnish of polyamide acid (PI-2500 of Du Pont de Nemours) was coated to a thickness of 1.1 μm on a silicon substrate. The coating was heated in a vacuum at 300° C. for 1 hour to form a polyimide film of 0.9 μm thickness. A polydimethylsiloxane having a vinyl group (SH-410 of Toray Silicone, Inc.) was coated to a thickness of 0.1 μm and was dried at 100° C. for 30 minutes. Then, line patterns of four different widths (0.5, 1, 2, and 5 μm) were drawn with an electron beam at an acceleration voltage of 20 kV from an elecron beam scanner. The sample was then transferred to a vacuum chamber kept at $10^{-3}$ Torr without being exposed to the ambient air. A methyl methacrylate monomer gas of 3 Torr was introduced to perform graft polymerization for 1 hour. Uniform graft polymer patterns were formed for the respective line patterns. Table 4 below shows the electron beam dose for obtaining a graft polymer polymethyl methacrylate film of 0.2 μm thickness for each pattern size together with the pattern widths of the formed graft polymer patterns.

TABLE 4

Changes in electron beam sensitivity and resolution with changes in pattern size (Example 12: 0.2 μm graft polymer pattern thickness, methyl methacrylate as monomer gas, 1 hour graft polymerization time, 0.9 μm thick polyimide film as lower layer of resist film, and 0.1 μm thick layer of polydimethylsiloxane having vinyl group as upper layer of resist film)

| Irradiation width (μm) | Electron beam ($10^{-6}$ C/cm$^2$) | Line width of graft polymer pattern (μm) |
|---|---|---|
| 0.5 | 90 | 0.55 |
| 1 | 73 | 1.1 |
| 2 | 65 | 2.15 |
| 5 | 60 | 5.3 |

As may be seen from Table 4 above, graft polymer patterns were formed with a high resolution.

Thereafter, polydimethylsiloxane was etched as in Example 1, and the polyimide film was etched by ion etching using the oxygen gas. Then, a micropattern including a submicron pattern was transferred into the polyimide film of 0.9 μm thickness with a high precision.

EXAMPLE 13

A 10% solution of a resin which is obtained by hydrolysis of 8 parts of diethoxydimethylsilane, 6 parts of triethoxymethylsilane and 1 part of diethoxyvinylmethylsilane in xylene-ligroin mixture (1:1 mixing ratio) was prepared. The solution was spin-coated on a silicon substrate to form a 0.4 μm thick film of a ternary curing-type silicone resin having a vinyl group. Line patterns of 5 μm width were drawn at various doses and at an acceleration voltage of 20 kV with an electron beam scanner. The sample was moved to a vacuum chamber kept at $10^{-3}$ Torr without being exposed to the ambient air. A refined and degassed styrene monomer gas was introduced into the chamber to a pressure of 3 Torr and the sample was left to stand for 1 hour for graft polymerization of the irradiated portion. Microscopic observation of the resist film revealed formation of uniform and glossy graft polymer polystyrene films at the irradiated portions and no formation of such films at the non-irradiated portions. The electron beam dose required for obtaining a graft polymer polystyrene film of about 0.2 μm thickness was about 10 μC/cm².

After the sample was heated at 150° for 30 minutes in the air, the silicone resin portion which is not covered with the graft polymer pattern, that is, the non-irradiated portion of the silicone resin film was etched by reactive ion etching using a gas mixture of $CF_4$ gas and 20% of $H_2$ gas. The ratio of the etching rates of the graft polymer polystyrene and the silicone resin was about 1:2. Thus, the silicone resin layer of 0.4 μm thickness could be etched using a graft polymer polystyrene film of 0.2 μm thickness as a mask.

In Examples 1 to 6 using polydimethylsiloxane rubber as the material of the silicone layer, the dose of high-energy beam was as high as 80 to 120 μC/cm². However, in Example 13 in which ternary curing-type silicone resin having a vinyl group was used as the material of the silicone layer, it was possible to reduce the dose of high-energy beam to about 10 μC/cm².

EXAMPLES 14 TO 18

In the same manner as in Example 13, a silicone resin was coated to a thickness of 0.4 μm on each of five silicon substrates. After the silicon substrates were irradiated with an electron beam in the same manner as in Example 13, they were transferred to vacuum chambers without being exposed to the ambient air. Radical addition polymerizable monomer gases were introduced into the respective vacuum chambers to a pressure of 3 Torr: methyl methacrylate for Example 14, methyl acrylate for Example 15, acrylonitrile for Example 16, divinylbenzene for Example 17, and maleimide for Example 18. The samples were left to stand for 1 hour to perform graft polymerization. Uniform and glossy graft polymer patterns were formed on the irradiated portions of the silicone resin layer in each case. The electron beam dose for obtaining a graft polymer pattern of 0.2 μm thickness is shown in Table 5 below.

TABLE 5

Electron beam sensitivity for formation of graft polymer pattern (0.2 μm graft polymer pattern Thickness, 1 hour graft polymerization time, 20 kV electron beam acceleration voltage, silicone resin having vinyl group for resist film of 0.4 μm thickness)

| Example | Monomer gas | Electron beam dose ($\times 10^{-6}$ C/cm²) |
|---|---|---|
| 13 | Styrene | 10.4 |
| 14 | Methyl methacrylate | 7.1 |
| 15 | Methyl acrylate | 8.2 |
| 16 | Acrylonitrile | 21.3 |
| 17 | Divinylbenzene | 9.6 |

TABLE 5-continued

Electron beam sensitivity for formation of graft polymer pattern (0.2 μm graft polymer pattern Thickness, 1 hour graft polymerization time, 20 kV electron beam acceleration voltage, silicone resin having vinyl group for resist film of 0.4 μm thickness)

| Example | Monomer gas | Electron beam dose ($\times 10^{-6}$ C/cm²) |
|---|---|---|
| 18 | Maleimide | 35.7 |

EXAMPLES 19 TO 22

Graft polymer patterns were formed substantially following the procedures of Example 13 using different silicone resins having a vinyl group. The silicone resin having a vinyl group used was a silicone resin obtained by reacting dimethylsiloxane oligomer having hydroxyl groups at two terminal ends (about 1,200 molecular weight) with triethoxyvinylsilane for Example 19, polyvinylmethylsiloxane having 20% methoxy groups at side chains for Example 20, a ternary silicone resin obtained by reacting vinylmethylsiloxane oligomer having hydrogen atoms at two terminal ends (about 2,000 molecular weight) with a platinum catalyst for Example 21, and a silicone resin obtained by mixing 5% by weight of silicone rubber having a vinyl group (SH 410 of Toray Silicone, Inc.) with a ternary crosslinked silicone resin (SR 2410 of Toray Silicone, Inc.) for Example 22. The electron beam dose for obtaining the graft polymer patterns of 0.2 μm thickness was as shown in Table 6 below.

TABLE 6

Electron beam sensitivity for formation of graft polymer pattern (0.2 μm graft polymer pattern thickness, 1 hour graft polymerization time, 20 kV electron beam acceleration voltage, 0.4 μm resist film thickness, and styrene gas as graft monomer gas)

| Example | Resist film | Electron beam dose ($\times 10^{-6}$ C/cm²) |
|---|---|---|
| 19 | Reaction product of dimethylsiloxane having hydroxyl groups at both terminals with tri-ethoxyvinylsilane | 10.8 |
| 20 | Polyvinylmethylsiloxane | 11.2 |
| 21 | Vinylmethylsiloxane oligomer having hydrogen atoms at both terminals | 13.3 |
| 22 | Mixture of ternary cross-linked silicone resin with silicone rubber having a vinyl group | 18.5 |

EXAMPLES 23 TO 25

Three samples were obtained by coating a silicone resin on silicon substrates and drying the coatings in the manner as in Example 13. Using 400 mesh copper meshes as masks, the samples were exposed to an X-ray from a Cu-L line of 13.3 Å for Example 23, a far-ultraviolet ray from a 500 W Xe-Hg lamp for Example 24, and an ion beam accelerated at an acceleration voltage of 34 kV from a liquid Ga-ion source for Example 25. The samples were then transferred to vacuum chambers kept at $10^{-3}$ Torr without being exposed to ambient air. Styrene gas was charged into the chambers to a pressure of 3 Torr for graft polymerization for 1 hour. Then, uniform and glossy graft polymer patterns were formed on the irradiated portions of the silicone resin layer in all of the samples. The doses of the respective beams for forming graft polymer patterns of 0.2 μm thickness are shown in Table 7 below.

TABLE 7

High-energy beam sensitivity for formation of graft polymer pattern (0.2 μm graft polymer pattern thickness, styrene as monomer gas, 1 hour graft polymerization time, and 0.4 μm resist film thickness)

| Example | Exposure source | Sensitivity |
|---|---|---|
| 23 | Cu—L line (13.3 Å) | 1.1 J/cm$^2$ |
| 24 | Xe—Hg lamp (500 W) | 10 min radiation |
| 25 | Ga—ion (34 kV) | 0.15 μC/cm$^2$ |

EXAMPLE 26

The silicone resin prepared by the same method as that in Example 13 was irradiated with an electron beam accelerated at an acceleration voltage of 20 kV for forming line patterns of 0.5, 1, 2 and 5 μm width with an electron beam scanner. The sample was placed in a vacuum chamber kept at 10$^{-3}$ Torr without being exposed to the ambient air. After styrene monomer gas was introduced into the chamber, graft polymerization was performed for 1 hour. Uniform graft polymer patterns were formed for the respective patterns. Table 8 below shows the electron beam dose for obtaining the graft polymer pattern of 0.2 μm thickness for each pattern size together with the line widths of the formed graft polymer patterns.

TABLE 8

Changes in electron beam sensitivity and resolution with changes in pattern size (Example 28: 0.2 μm graft polymer pattern thickness, styrene as monomer gas, 1 hour graft polymerization time, and 0.4 μm resist film thickness)

| Irradiation width (μm) | Electron beam sensitivity (10$^{-6}$ C/cm$^{-2}$) | Line width of graft polymer pattern (μm) |
|---|---|---|
| 0.5 | 15.8 | 0.55 |
| 1 | 13.1 | 1.1 |
| 2 | 11.6 | 2.15 |
| 5 | 10.4 | 5.3 |

EXAMPLE 27

A varnish of polyamide acid (PI 2500 of Du Pont de Nemours) was coated to a thickness of 1.1 μm on a thermally oxidized silicon substrate surface. The coating was dried at 300° C. for 1 hour to form a polyimide film of about 0.9 μm thickness. The silicone resin having a vinyl group as that used in Example 13 was spin-coated thereover to a thickness of 0.1 μm. After drying the film under a nitrogen stream at 100° C. for 30 minutes, it was irradiated with an electron beam accelerated at an acceleration voltage of 20 kV to draw lines of 5 μm width at various doses with an electron beam scanner. The sample was then placed in a vacuum chamber kept at 10$^{-3}$ Torr without being exposed to the ambient air. A refined and degassed styrene monomer gas was introduced into the chamber to perfrom graft polymerization for 1 hour. Microscopic observation revealed formation of uniform and glossy graft polymer patterns on the irradiated portions of the silicone resin layer and no formation of such films on the non-irradiated portions. The electron beam dose for forming a graft polymer polystyrene film of about 0.2 μm thickness was about 10 μC/cm$^2$.

The sample was then heated at 150° in the air for 30 minutes and was then etched by reactive ion etching in a gas mixture of CF$_4$ with 10% of H$_2$ gas so as to etch the silicone resin film portions which were not covered with the graft polymer patterns. The ratio of the etching rates of the graft polymer polystyrene film and the silicone resin film in this etching gas was about 1:1.3. Using the graft polymer polystyrene film of 0.2 μm as a mask, the silicone resin film of 0.1 μm thickness could be etched satisfactorily. Subsequently, the polyimide film portions which were not covered with the silicone resin film were etched by reactive ion etching using O$_2$ gas. The reactive ion etching ratio of the polyimide film to the silicone resin film at a pressure of 0.03 Torr and an oxygen gas flow rate of 5 cc/min was about 40:1. Therefore, even after the polyimide film of about 0.9 μm thickness at the non-irradiated portions was completely etched, substantially no decrease in the film thickness was observed at the irradiated portions. In this manner, the graft polymer pattern of 0.2 μm thickness was transferred to the polyimide film of 0.9 μm thickness. Using this polyimide film of 0.9 μm thickness, the thermal oxide film in the surface layer of the silicon substrate was etched by reaction ion etching using a gas mixture of CF$_4$ gas and H$_2$ gas so as to form a silicon oxide pattern of 1 μm depth.

EXAMPLES 28 TO 32

Graft polymer patterns were formed in the same manner as that in Examples 13 to 18 using the bilayered structure of the polyimide film of 0.9 μm thickness and the silicone resin layer of 0.1 μm thickness formed in the same manner as in Example 27. The electron beam dose required for forming a graft polymer pattern of 0.2 μm thickness was as shown in Table 9 below.

TABLE 9

Electron beam sensitivity for formation of graft polymer pattern (0.1 μm graft polymer pattern thickness, 1 hour graft polymerization time, 20 kV electron beam acceleration voltage, 0.9 μm thick polyimide film as lower layer of resist film, and 0.1 μm thick film of silicone resin having vinyl group as upper layer of resist film)

| Example | Monomer gas | Electron beam dose (× 10$^{-6}$ C/cm$^2$) |
|---|---|---|
| 28 | Styrene | 13.7 |
| 29 | Methyl methacrylate | 9.6 |
| 30 | Methyl acrylate | 11.0 |
| 31 | Acrylonitrile | 30.5 |
| 32 | Divinylbenzene | 12.4 |

Thereafter, the silicone resin layer was etched by the same method as in Example 27, and the poyimide film was then etched. In each sample, the pattern of the graft polymer pattern was transferred to the polyimide film.

EXAMPLE 33

The procedures of Example 27 were followed except that the silicone resins as those used in Examples 19 to 22 were used. In each case, the graft polymer pattern was transferred to the polyimide film.

EXAMPLE 34

The procedures of Example 27 were followed except that the electron beam dose was 4, 7, 10 and 20 μC/cm$^2$ so as to draw line patterns of 0.3, 0.5, 0.7 and 1.0 μm width. Thereafter, graft polymerization and dry etching were performed as in Example 13. The electron beam dose required and the final polyimide line width were as shown in Table 10 below.

TABLE 10

Electron beam dose and pattern widening (1 hour graft polymerization time, 20 kV electron beam acceleration voltage, styrene as graft monomer gas, polyimide film of 0.9 μm thickness as lower layer of resist film, and 0.1 μm thick layer of silicone resin having vinyl group as upper layer of resist film)

| Electron beam dose ($\times 10^{-6}$ C/cm$^2$) | Graft polymer pattern thickness (μm) | Line pattern (μm) | | | |
|---|---|---|---|---|---|
| | | 0.3 | 0.5 | 0.7 | 1.0 |
| 4 | 0.08 | 0.27 | 0.46 | 0.69 | 0.99 |
| 7 | 0.15 | 0.31 | 0.52 | 0.72 | 1.05 |
| 10 | 0.20 | 0.34 | 0.55 | 0.76 | 1.10 |
| 20 | 0.38 | 0.36 | 0.58 | 0.80 | 1.21 |

COMPARATIVE EXAMPLE 1

The procedures of Example 13 were followed except that the ternary crosslinked silicone rubber (SR 2410 of Toray Silicone, Inc.) was used. The electron beam dose necessary for forming a graft polymer polymethyl methacrylate film of about 0.2 μm thickness was about 300 μC/cm$^2$, in contrast to only about 10 μC/cm$^2$ for Example 13 using ternary curing-type silicone resin having a vinyl group as the material of the silicone layer.

COMPARATIVE EXAMPLE 2

The procedures of Example 13 were followed except that a room-temperature valcanizing silicone rubber (TSE 3032 of Toshiba Silicone, Inc.) was used. The electron beam-irradiated portions of the silicon rubber layer alone were swollen and graft polymerization could not be effected.

However, in Example 13 using a silicone layer consisting of ternary curing-type silicone resin having a vinyl group, it was possible to suppress the swelling of the electron beam-irradiated portion of the silicone layer, making it possible to perform the graft polymerization satisfactorily.

COMPARATIVE EXAMPLE 3

The procedures of Example 26 were followed except that a polydimethylsiloxane rubber having a vinyl group (SH-410 of Toray Silicone, Inc.) was used. When the resolution was measured, line widths of the graft polymer patterns were 0.7, 1.2, 2.5, and 6.0 μm for the irradiation width of 0.5, 1, 2 and 5 μm, respectively.

However, in Example 26 using a silicone layer consisting of ternary curing-type silicone resin having a vinyl group, the line widths of the graft polymer patterns were substantially equal to the irradiation width. In other words, Example 26 was markedly superior to Comparative Example 3 in resolution.

What we claim is:

1. A method for forming a micropattern, comprising the steps of:
    forming an organic polymeric material layer on a substrate;
    forming a silicone layer on said organic polymeric material layer;
    selectively irradiating a surface of said silicone layer with a high-energy beam;
    exposing the surface of said silicone layer to a radical addition polymerizable monomer gas so as to form a graft polymer film on an irradiated portion of the surface of said silicone layer;
    performing dry etching using said graft polymer film as a mask so as to form a pattern of said silicone layer; and
    performing dry etching using said pattern of said silicone layer as a mask so as to form a pattern of said organic polymeric material layer.

2. A method according to claim 1, wherein said step of performing dry etching so as to form said pattern of said silicone layer comprises a reactive ion etching using a mixture of tetrafluoride gas and hydrogen gas.

3. A method according to claim 1, wherein said step of performing dry etching so as to form said pattern of said organic polymeric material layer comprises a reactive ion etching using oxygen gas.

4. A method according to claim 1, wherein said silicone layer comprises a silicone resin layer.

5. A method according to claim 4, wherein said silicone resin layer comprises a ternary curing-type silicone resin having a vinyl group.

6. A method according to claim 1, wherein said organic polymeric material layer is thicker than said silicone resin layer.

7. A method according to claim 1, wherein said substrate comprises a silicon substrate.

8. A method according to claim 1, wherein said monomer gas comprises a styrene gas.

9. A method for forming a micropattern, comprising the steps of:
    forming a ternary curing-type silicone resin layer of a ternary curing-type silicone resin having a vinyl group on a substrate;
    selectively irradiating a surface of said silicone resin layer with a high-energy beam;
    exposing the surface of said silicone resin layer to a radical addition polymerizable monomer gas so as to form a graft polymer film on an irradated portion of said silicone resin layer; and
    performing dry etching using said graft polymer film as a mask so as to form a pattern of said silicone resin layer.

10. A method according to claim 9, wherein said step of performing dry etching for forming said pattern of said silicone resin layer comprises a reactive ion etching using a mixture of tetrafluoride gas and hydrogen gas.

11. A method according to claim 9, wherein said substrate comprises a silicon substrate.

12. A method according to claim 9, wherein said monomer gas comprises a styrene gas.

* * * * *